United States Patent
Allen et al.

(10) Patent No.: US 7,749,422 B2
(45) Date of Patent: Jul. 6, 2010

(54) RELEASE LAYER FOR IMPRINTED PHOTOCATIONIC CURABLE RESINS

(75) Inventors: Robert D. Allen, San Jose, CA (US);
Mark W. Hart, San Jose, CA (US);
Frances Houle, Fremont, CA (US);
Hiroshi Ito, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/694,117

(22) Filed: Mar. 30, 2007

(65) Prior Publication Data

US 2008/0241418 A1    Oct. 2, 2008

(51) Int. Cl.
*B29C 35/08* (2006.01)
(52) U.S. Cl. .................................. 264/496; 977/887
(58) Field of Classification Search ................. 264/496; 977/877; 430/5, 311, 269, 270.1
See application file for complete search history.

(56) References Cited

U.S. PATENT DOCUMENTS

| | | | |
|---|---|---|---|
| 4,959,105 A * | 9/1990 | Neidiffer et al. ............ | 134/3 |
| 6,696,220 B2 | 2/2004 | Bailey et al. | |
| 6,916,584 B2 | 7/2005 | Sreenivasan et al. | |
| 6,916,585 B2 | 7/2005 | Sreenivasan et al. | |
| 2003/0180468 A1 * | 9/2003 | Cray et al. ................ | 427/387 |
| 2004/0191639 A1 | 9/2004 | Jin et al. | |
| 2005/0069816 A1 | 3/2005 | Jung et al. | |
| 2007/0051697 A1 * | 3/2007 | DiPietro et al. ............ | 216/52 |

OTHER PUBLICATIONS

Min Jung Lee, Nae yoon Lee, Ju Ri Lim, Jong Bok Kim, Mihee Kim, Hong Koo Baik, and Youn Sang Kim, "Antiadhesion Surface Treatments of Molds for High-Resolution Unconventional Lithography", Nov. 10, 2006, Advanced Materials, vol. 18, Issue 23, p. 3115-3119.*
Johnson et al., "Advances in Step and Flash Imprint Lithography", Feb. 2003, SPIE Microlithography Conference.*
Houle, Frances A., et al., article entitled "Adhesion between template materials and UV-cured nanoimprint resists", IBM Almaden Research Center, San Jose, CA. USA and Dept. of Materials Science and Engineering, Stanford University, Stanford, CA (Undated), pp. 1-8.
Colburn, M., et al., article entitled "Step and Flash imprint Lithography: A New Approach to High-Resolution Patterning", Texas Materials Institute, The Univ. of Texas at Austin, Austin, TX (Undated), pp. 1-11.

(Continued)

*Primary Examiner*—Christina Johnson
*Assistant Examiner*—Galen Hauth
(74) *Attorney, Agent, or Firm*—Cantor Colburn LLP

(57) ABSTRACT

An imprint process comprising coating a selected surface of a micropatterned template with a release composition having a basic reactive moiety; wherein the template is transparent to UV radiation; imprinting the template onto a photocationically curable composition; curing the UV curable composition to form an imprinted composition, wherein the release composition having a basic reactive moiety is effective to locally inhibit curing of the composition at an interface between the template and the imprinted composition; and releasing the template from the imprinted composition.

6 Claims, 3 Drawing Sheets

OTHER PUBLICATIONS

Jung Gun-Young et al., article entitled "Vapor-Phase Self-Assembled Monolayer for Improved Mold Release in Nanoimprint Lithography", 2005 American Chemical Society; Langmuir, vol. 21, No. 4, 2005, pp. 1158-1161.

Bailey, T., et al., article entitled "Step and flash imprint lithography: Template surface treatment and defect analysis", J. Vac. Sci. Technol. B—Microelectronics and Nanometer Structures, vol. 18, No. 6, Nov./Dec. 2000, pp. 3572-3577.

Bailey, Todd Christopher., Thesis entitled "Imprint Template Advances and Surface Modification, and Defect Analysis for Step and Flash Imprint Lithography" Graduate School of The University of Texas at Austin, Aug. 2003, pp. i-xx and pp. 1-296. (EFS Filing Consists of 7 Parts).

Houle, Frances A., et al., article entitled "Adhesion between template materials and UV-cured nanoimprint resists", IBM Almaden Research Center, San Jose, CA, USA and Dept. of Materials Science and Engineering, Stanford University, Stanford, CA (Undated), pp. 1-8.

Colburn, M., et al., article entitled "Step and Flash imprint Lithography: A New Approach to High-Resolution Patterning", Texas Materials Institute, The Univ. of Texas at Austin, Austin, TX (Undated), pp. 1-11.

Jung Gun-Young et al., article entitled "Vapor-Phase Self-Assembled Monolayer for Improved Mold Release in Nanoimprint Lithography", 2005 American Chemical Society; Langmuir, vol. 21, No. 4, 2005, pp. 1158-1161.

Bailey, T., et al., article entitled "Step and flash imprint lithography: Template surface treatment and defect analysis", J. Vac. Sci. Technol. B - Microelectronics and Nanometer Structures, vol. 18, No. 6, Nov/Dec 2000, pp. 3572-3577.

Bailey, Todd Christopher., Thesis entitled "Imprint Template Advances and Surface Modification, and Defect Analysis for Step and Flash Imprint Lithography" Graduate School of the University of Texas at Austin, Aug. 2003, pp.,i-xx and pp. 1-296. (EFS Filing Consists of 7 Parts).

* cited by examiner

RELEASE LAYER FOR IMPRINTED PHOTOCATIONIC CURABLE RESINS

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to release layers for templates used in imprint lithography, and more particularly, to release layers and the use thereof for release of templates used in step and flash imprinting processes of photocationic curable films.

2. Description of Background

Imprint lithography has emerged in various forms as a potential alternative to conventional photolithography because of its ability to print smaller features at low cost. Step and flash imprint lithography (SFIL) is a variant of imprint lithography that is amenable to the resolution and overlay requirements necessary for the fabrication of advanced semiconductor devices. In SFIL, a low-viscosity photosensitive molding material is molded between a mechanically rigid template having a relief pattern and a substrate and then is exposed to actinic radiation. The resulting hardened layer, having a three dimensional pattern, can be used as an etch mask to transfer the imprinted pattern into the substrate below.

It is generally necessary to pre-coat the template with a release agent to avoid sticking of the newly cured molding material to the template. Fluorosilanes have been widely used as release agents. The original assumption and impetus for using fluorosilanes is that by providing a low energy surface adjacent to the cured resist the adhesion energy will be minimized because the physical and chemical attraction between the two surfaces will be minimized. However, it has been found that that although the energy of the release coating is low this coating is not inert. Single and multiple cure passes are found to degrade the fluorosilane coating by lowering its fluorine concentration.

Release coating failure of fluorosilanes is believed attributable to chemical attack because of the proximity of free radicals or acid, which drive the curing reaction of the photosensitive molding material. This results not only in loss of fluorine, but can lead to higher template adhesion due to chemical bond formation of the template with the cured material. For example, for one free radical cure formulation studied, the free radical attack on the release layer lead to higher adhesion to the template than if there were no release layer present.

In another example, cured vinyl ether resists exhibited segregation of the ionic photoacid generator (PAG) to the surface of the film as determined by angle-resolved x-ray photoemission. The locally high concentration of PAG can be expected to ensure maximum consumption of monomers during polymerization as well as provide conditions for efficient attack of the release layer. As a result, the fluorosilane release coatings can fail to provide a benefit.

It is also noted that the adhesion energy of cured resists to a fluorosilane-coated template varies significantly with resist chemistry. For example, the acrylates tend to have lower adhesion ($<$1-2 J/m$^2$) than the vinyl ethers ($>$4-5 J/m$^2$ and often much higher).

Because it is generally desirable to reduce adhesion in order to minimize the possibility of damaging the newly cured resist layer during template removal, it would be advantageous to have a release layer that reduces the extent of polymerization and hence fracture toughness near the surface, thus facilitating crack propagation at the resist-release interface during cure. A release layer that would achieve this goal must not be itself attacked or degraded during cure. There is no mechanism for the widely used fluorosilane layer to achieve this goal.

Accordingly, there is a need in the art for improved release layers for templates used in step and flash imprint lithography. The release layers for templates must be thin, a few monolayers at most, and very smooth to avoid interfering with pattern dimension control.

SUMMARY OF THE INVENTION

The shortcomings of the prior art are overcome and additional advantages are provided through the provision of a step and flash imprint process comprising coating a selected surface of a micropatterned template with a release composition having a basic reactive moiety; wherein the template is transparent to UV radiation; imprinting the template onto a photocationically curable composition; curing the photocationically curable composition to form an imprinted composition, wherein the release composition having the basic reactive moiety is effective to locally inhibit curing of the composition at an interface between the template and the imprinted composition; and releasing the template from the imprinted composition.

In another embodiment, a step and flash imprint process comprises coating a selected surface of a micropatterned template with γ-aminopropyltriethylsiloxane; wherein the template is transparent to UV radiation; imprinting the template onto a UV curable vinyl ether photoresist composition; curing the UV curable vinyl ether photoresist to form a cured vinyl ether composition, wherein the γ-aminopropyltriethylsiloxane is effective to locally inhibit curing of the composition at an interface between the template and the cured vinyl ether composition; and releasing the template from the UV curable composition.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution that provides for effective release of a template from a photocationic curable composition. The invention utilizes a release agent having a reactive moiety that locally inhibits curing at an interface between the template and the curable composition.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
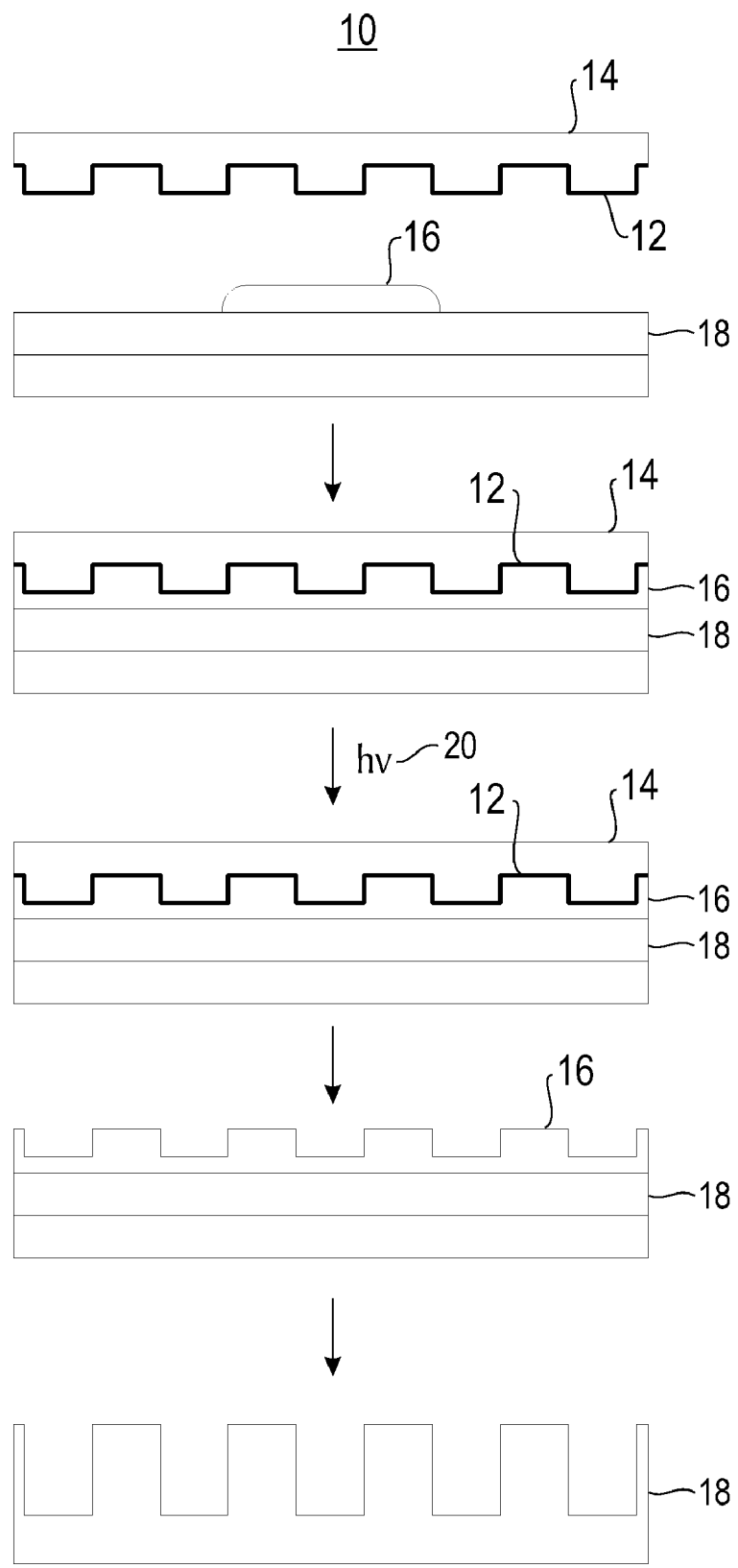
FIG. 1 illustrates an exemplary imprint lithography process.

The detailed description explains the preferred embodiments of the invention, together with advantages and features, by way of example with reference to the drawings.

DETAILED DESCRIPTION OF THE INVENTION

It has been found that a release composition having a basic reactive moiety inhibits acid catalysis near the surface of the imprintable medium provides for an improved release of templates used for imprinting the imprintable medium. In one embodiment, the imprintable medium comprises a photopolymerizable monomer, which may be a cationically polymerizable monomer. For ease of understanding, specific reference will be made herein to vinyl ether cationically polymerizable monomers and oligomers. However, one of skill in the art will recognize that the release composition having the basic reactive moiety can be used for other cationically polymerizable imprintable mediums. For example, other suitable cationically polymerizable monomers include monomers/oligomers having at least one cationic polymerizable group such as an epoxide group, an oxetane group, an ether group, a vinyl group, combinations of the foregoing, and the like.

The release composition having the basic reactive moiety functions to inhibit acid catalysis at an interface between the template and the cured composition, which advantageously results in improved release characteristics to the template. Suitable release agents include, but are not limited to, amino functionalized silanes, phosphinosilanes, and the like. In one embodiment, the organic base release layer is γ-aminopropyltriethylsiloxane (APTES), the formula (I) of which is shown below:

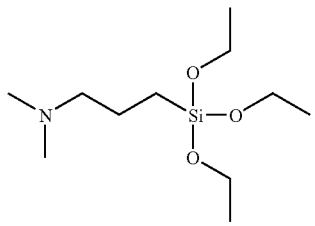

(I)

APTES is a well-known coupling agent generally used to increase adhesion of polymer coatings to glass fibers. On glass, APTES has a metastable conformation with the amino group hydrogen bonded to surface OH groups. As such, it was surprising and unexpected that APTES would provide improved release as compared to other release agents such as the fluorosilane releasing agents discussed in the background section above. The APTES release layer can be applied to any suitable template by solution or vapor phase processes to form an improved release layer of less than a 3 nanometers in thickness for imprintable vinyl ether curable resists. The template can be composed of materials such as metals, alloys, metal oxides, glass, quartz, combinations thereof and the like.

In one embodiment, the template is substantially transparent to the radiation wavelength(s) employed to cure and polymerize the resist.

Hereinafter, the terms "polymerizable," "polymerize", "polymerizing" or "to polymerize" relate to any chemical process that results in formation of a chain or polymer based on repeating monomers or oligomers. Hereinafter, there terms "curable," "cure", "curing" or "to cure" relate to polymerization to high molecular weight with crosslinking.

The vinyl ether curable resists include monomers having at least one vinyl ether having at least one vinyl ether group ($CR_2$=CRO—), wherein the at least one vinyl ether may be represented by the following structures (II-VII):

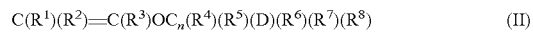  (II)

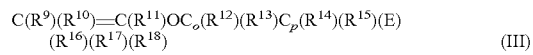  (III)

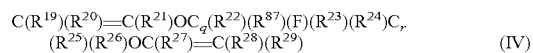  (IV)

(V)

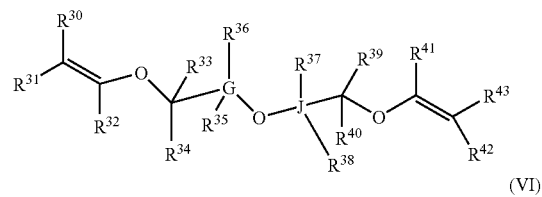

(VI)

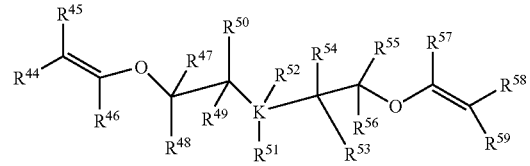

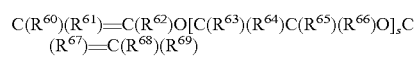  (VII)

Each D, E, F, G, J, and K may be independently at each occurrence either a carbon or a silicon atom.

Each n, o, p, q, r, and s, (n-s) may be independently at each occurrence represented by integers from 0 to 6, wherein a sum of the integers (n-s) in any one of the vinyl ethers may be ≦6.

Each $R^1, R^2, R^3, R^4, R^5, R^6, R^7, R^8, R^9, R^{10}, R^{11}, R^{12}, R^{13}, R^{14}, R^{15}, R^{16}, R^{17}, R^{18}, R^{19}, R^{20}, R^{21}, R^{22}, R^{23}, R^{24}, R^{25}, R^{26}, R^{27}, R^{28}, R^{29}, R^{30}, R^{31}, R^{32}, R^{33}, R^{34}, R^{35}, R^{36}, R^{37}, R^{38}, R^{39}, R^{40}, R^{41}, R^{42}, R^{43}, R^{44}, R^{45}, R^{46}, R^{47}, R^{48}, R^{49}, R^{50}, R^{51}, R^{52}, R^{53}, R^{54}, R^{55}, R^{56}, R^{57}, R^{58}, R^{59}, R^{60}, R^{61}, R^{62}, R^{63}, R^{64}, R^{65}, R^{66}, R^{67}, R^{68}$, and $R^{69}$ ($R^1$-$R^{69}$) may be independently at each occurrence a hydrogen atom or a hydrocarbyl substituent with a primary, a secondary or a tertiary carbon attachment point.

The hydrocarbyl substituent may be selected from the group consisting of a linear alkyl or a linear alkoxy group having 1-6 carbon atoms, a branched alkyl or branched alkoxy group having 2-12 carbon atoms, a cycloalkyl, a bicycloalkyl, a cycloalkoxy or a bicycloalkoxy group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, an aryl group, an aralkyl group, an alkaryl group, an alkenyl group, a cycloalkenyl group, a dihydropyranyl group, a dihydrofuranyl group, an alkalkenyl group, an alkenylalkyl group, an alkynyl group, an alkalkynyl group, an alkynylalkyl group, a trifluoromethyl group, a trifluoroethyl group, a trifluoropropyl group, a cyanopropyl group, a tris-trialkysily group, a tris-triarylsilyl group, a tris-trialkarylsilyl group, a tris-triaralkylsilyl group, a tris-trialkenylsilyl group, a tris-trifluoroalkyl group, a tris-trialkynylsilyl group, a tris-trifluoromethylsilyl group, a tris-trifluoroethylsilyl group, a tris-trifluoropropylsilyl group, and a tris-cyanopropylsilyl group.

The alkyl substituents in the tris-trialkylsilyl group include linear, branched, cyclic or bicyclic alkyl substituents having 1 to 21 carbon atoms.

The aryl substituents in the tris-triarylsilyl group include phenyl, naphthyl or phenanthryl.

The alkaryl substituents in the tris-trialkarylsilyl group include tolyl.

The aralkyl substituents in the tris-triaralkylsilyl group include benzyl.

The alkenyl substituents in the tris-trialkenylsilyl group include vinyl.

The fluoroalkyl substituents in the tris-trifuoroalkyl group include linear or branched fluorinated alkyl groups having 2-12 carbon atoms, or fluorinated cycloalkyl groups having 3-17 carbon atoms.

The alkynl substituents in the tris-trialkynylsilyl group include ethynyl groups.

The at least one vinyl ether (II) of the coating composition may be $CH_2$=$CHOCH_2Si(CH_3)_3$, wherein D is the silicon atom, wherein n is 1, wherein $R^1$, $R^2$, $R^3$, $R^4$ and $R^5$ are H, and wherein $R^6$, $R^7$ and $R^8$ are methyl groups.

Alternatively, the at least one vinyl ether (III) of the coating composition may be $CH_2$=$CHOCH_2CH_2Si(CH_3)_3$, wherein E is the silicon atom, wherein o and p are 1, wherein $R^9$, $R^{10}$, $R^{11}$, $R^{12}$, $R^{13}$, $R^{14}$ and $R^{15}$ are H, and wherein $R^{16}$, $R^{17}$ and $R^{18}$ are methyl groups.

Alternatively, the at least one vinyl ether (IV) of the coating composition may be $CH_2$=$CHOCH_2Si(CH_3)_2CH_2$ $OCH$=$CH_2$, wherein F is the silicon atom, wherein q and r are 1, wherein $R^{19}$, $R^{20}$, $R^{21}$, $R^{22}$, $R^{25}$, $R^{26}$, $R^{27}$ $R^{28}$ and $R^{29}$ are H, and wherein $R^{23}$ and $R^{24}$ are independently methyl groups or $CH_2$=$CHOCH_2C(CH_3)_2CH_2OCH$=$CH_2$, wherein F is the carbon atom, wherein q and r are 1, wherein $R^{19}$, $R^{20}$, $R^{21}$, $R^{22}$, $R^{25}$, $R^{26}$, $R^{27}$ $R^{28}$ and $R^{29}$ are H, and wherein $R^{23}$ and $R^{24}$ are methyl groups.

Alternatively, the at least one vinyl ether (V) of the coating composition may be $CH_2$=$CHOCH_2Si(CH_3)_2OSi(CH_3)_2$ $CH_2OCH$=$CH_2$, wherein G and J are the silicon atoms, wherein $R^{30}$, $R^{31}$, $R^{32}$, $R^{28}$, $R^{29}$, $R^{34}$ $R^{39}$, $R^{40}$, $R^{41}$, $R^{42}$ and $R^{43}$ are H, and wherein $R^{35}$, $R^{36}$, $R^{37}$ and $R^{38}$ are methyl groups.

Alternatively, the at least one vinyl ether (VI) of the coating composition may be $CH_2$=$CHOCH_2CH_2Si(CH_3)_2$ $CH_2CH_2OCH$=$CH_2$, wherein K is the silicon atom, wherein $R^{44}$, $R^{45}$, $R^{46}$, $R^{47}$, $R^{48}$, $R^{49}$, $R^{50}$, $R^{53}$, $R^{54}$, $R^{55}$, $R^{56}$, $R^{57}$, $R^{58}$ and $R^{59}$ are H, wherein $R^{51}$ and $R^{52}$ are independently methyl groups or $CH_2$=$CHOCH_2CH_2C(CH_3)_2CH_2CH_2OCH$= $CH_2$, wherein K is the carbon atom, wherein $R^{44}$, $R^{45}$, $R^{46}$, $R^{47}$, $R^{48}$, $R^{49}$, $R^{50}$, $R^{53}$, $R^{54}$, $R^{55}$, $R^{56}$, $R^{57}$, $R^{58}$ and $R^{59}$ are H and wherein $R^{51}$ and $R^{52}$ are methyl groups.

Alternatively, the at least one vinyl ether (IV) of the coating composition may be $CH(CH_3)$=$CHOCH_2Si(CH_3)$ $(CH_2OCH$=$CH(CH_3))CH_2OCH$=$CH(CH_3)$, wherein F is the silicon atom, wherein q and r are 1, wherein $R^{19}$, $R^{21}$, $R^{22}$, $R^{25}$, $R^{26}$, $R^{27}$ and $R^{28}$ are H, wherein $R^{20}$, $R^{23}$ and $R^{29}$ are methyl, and wherein $R^{24}$ is —$CH_2OCH$=$CH(CH_3)$.

Alternatively, the at least one vinyl ether (III) of the coating composition may be $CH_2$=$CHOCH_2CH_2Si(Si(CH_3)_3)_3$, wherein E is the silicon atom, wherein o and p are 1, wherein $R^9$, $R^{10}$, $R^{11}$, $R^{12}$, $R^{13}$, $R^{14}$ and $R^{15}$ are H, and wherein $R^{16}$, $R^{17}$ and $R^{18}$ are trimethylsilyl groups.

Alternatively, the at least one vinyl ether (IV) of the coating composition may be $CH(CH_3)$=$CHOCH_2C(CH_3)$ $(CH_2OCH$=$CH(CH_3))CH_2OCH$=$CH(CH_3)$, wherein F is the carbon atom, wherein q and r are 1, wherein $R^{19}$, $R^{21}$, $R^{22}$, $R^{25}$, $R^{26}$, $R^{27}$ and $R^{28}$ are H, wherein $R^{20}$, $R^{23}$ and $R^{29}$ are methyl, and wherein $R^{24}$ is —$CH_2OCH$=$CH(CH_3)$.

Alternatively, the at least one vinyl ether (II) of the coating composition may be $CH_2$=$CHOCH_2CF_3$, wherein D is the carbon atom, wherein n is 1, wherein $R^1$, $R^2$, $R^3$, $R^4$ and $R^5$ are H, and wherein $R^6$, $R^7$ and $R^8$ are fluorine groups.

Alternatively, the at least one vinyl ether (II) of the coating composition may be dihydrofuran, wherein D is the carbon atom, wherein n is 0, wherein $R^1$ is methylene, wherein $R^2$, $R^3$, $R^4$ and $R^5$ are H, wherein $R^6$ is methylene, and wherein $R^7$ and $R^8$ are hydrogen atoms, or dihydropyran, wherein D is the carbon atom, wherein n is 1, wherein $R^1$ is methylene, wherein $R^2$, $R^3$, $R^4$ and $R^5$ are H, wherein $R^6$ is methylene, and wherein $R^7$ and $R^8$ are hydrogen atoms.

Suitable epoxides and oxetanes are cyclic ethers having three (one oxygen, two carbon atoms) and four atoms (one oxygen and three carbon atoms), respectively. For example, aliphatic and aromatic monofunctional and/or polyfunctional oxetane compounds can be used. Specific non-limiting examples of the aliphatic or aromatic oxetane monomers that can be used include 3-ethyl-3-hydroxymethyloxetane, 3-ethyl-3-phenoxymethyloxetane, xylylene dioxetane, bis(3-ethyl-3-oxetanylmethyl)ether, and the like. These monofunctional and/or polyfunctional oxetane compounds can be used alone or as mixtures of two or more. Alicyclic epoxy compounds can also be used such as for example, 3,4-epoxycyclohexylmethyl methacrylate and 3,4-epoxycyclohexylmethyl-3',4'-epoxycyclohexane carboxylate.

The coating composition may further include a radiation sensitive photoacid generator (PAG). In certain embodiments of the present invention, PAGs may be used in the coating composition. These PAGs are compounds that generate an acid upon exposure to radiation. In various embodiments, any suitable photoacid generating agent may be used, so long as the selected photoacid generator dissolves sufficiently in the coating composition, or in the coating composition and an organic solvent, and the resulting solution thereof may form a coating on a substrate by a dispensing process, or spin coating, or the like. As is well known to those skilled in the art after reading the present application, the following illustrative classes of photoacid generators may be employed in various embodiments of the present invention.

Any suitable photoacid generator can be used in the present invention's stable viscosity coating composition. Typical photoacid generators include, without limitation: (1) sulfonium salts, such as triphenylsulfonium perfluoromethanesulfonate (triphenylsulfonium triflate), triphenylsulfonium perfluorobutansulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benezenesulfonate, tris(t-butylphenyl)sulfonium perfluorooctane sulfonate, diphenylethylsulfonium chloride, and phenacyldimethylsulfonium chloride; (2) halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)iodonium triflate, and bis-(t-butylphenyl)-iodonium camphanylsulfonate; (3) α,α'-bis-sulfonyl-diazomethanes such as bis(p-toluenesulfonyl) diazomethane, methylsulfonyl p-toluenesulfonyldiazomethane, 1-cyclohexylsulfonyl-1-(1,1dimethylethylsulfonyl) diazomethane, and bis(cyclohexylsulfonyl)diazomethane; (4) trifluoromethanesulfonate esters of imides and hydroxyimides, e.g., α-(trifluoromethylsulfonyloxy)-bicyclo[2.2.1]hept-5-ene-2,3-dicarboximide (MDT); (5) nitrobenzyl sulfonate esters such as 2-nitrobenzyl p-toluenesulfonate, 2,6dinitrobenzyl p-toluenesulfonate, and 2,4-dinitrobenzyl p-trifluoromethylbenzene sulfonate; (6) sulfonyloxynaphthalimides such as N-camphorsulfonyloxynaphthalimide and N-pentafluorophenylsulfonyloxynaphthalimide; (7) pyrogallol derivatives (e.g., trimesylate of pyrogallol); (8) naphthoquinone-4-diazides; (9) alkyl disulfones; (10) s-triazine derivatives; and (11) miscellaneous sulfonic acid generators including t-butylphenyl-α-(ptoluenesulfonyloxy)-acetate, t-butyl-α-(p-toluenesulfonyloxy)acetate, and N-hydroxynaphthalimide dodecane sulfonate (DDSN), and benzoin tosylate.

Additional suitable acid generators useful in conjunction with the coating compositions and methods provided herein will be known to those skilled in the art.

The PAG of the coating composition may include at least one of the following structures (X-XII):

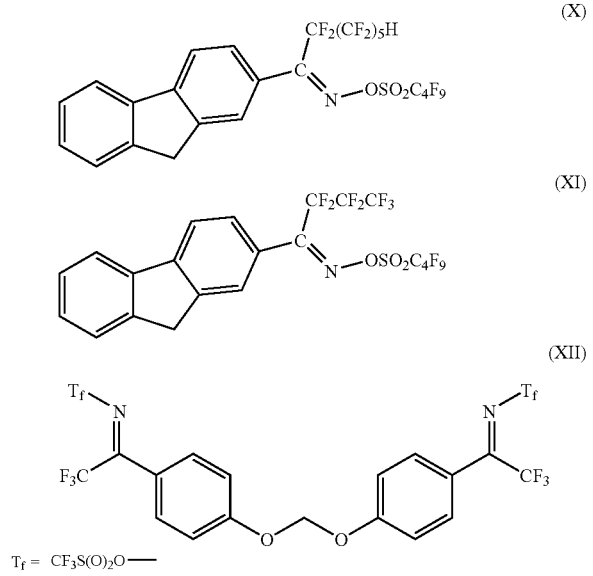

$T_f = CF_3S(O)_2O—$

FIG. 1 illustrates an exemplary step and flash imprint process 10 for which the basic release component layer can be utilized. The process first includes depositing the basic release component layer 12 onto a rigid template 14 and applying a photocationic polymerizable imprintable medium 16 e.g., a vinyl ether monomer, onto a base substrate 18. The template 14 and the substrate are then aligned and the gap between them decreased such that the imprintable medium is imprinted with the features of the template. The imprintable medium is then illuminated through the backside of the template with activating radiation 20 to photocationically cure the imprintable medium. The template is then withdrawn leaving the now cured and imprinted medium with relatively low aspect ratio, high-resolution features. The cured and imprinted medium is then etched to form high aspect ratio high resolution features. The use of the basic release component layer, e.g., APTES, provides effective release of the template from the cured and imprinted medium.

The following examples are presented for illustrative purposes only, and are not intended to limit the scope of the invention.

EXAMPLES

In this example, the efficacy of APTES for release was tested using a double cantilever beam delamination instrument and x-ray photoemission spectroscopy (XPS) for characterization of the resist-template interface. The specimens for study comprised a silicon substrate coated with an adhesion promoter (1 to 2 nm thick film of o-(vinyloxybutyl)-n-(triethoxysilylpropyl) urethane), onto which 4 to 6 microliters of liquid resist were dispensed prior to being covered with an unpatterned UV-transparent quartz template. The template material was pre-coated with either a very thin (1 to 2 monolayers) APTES release layer deposited from the gas phase, or with a fluorosilane layer prepared using a commercially available solution Cytonix FSD4500 (2 to 3 nm thick). The liquid resist was a vinyl ether formulation composed of 1:1 diethyleneglycol divinyl ether and dimethylsilane divinyl ether with CGI 1907 photoacid generator (PAG) and 9-antracene methanol sensitizer/stabilizer. Following assembly the specimens were cured using 365 nm light with a dose of approximately 80 mJ/cm$^2$.

Figure 2:
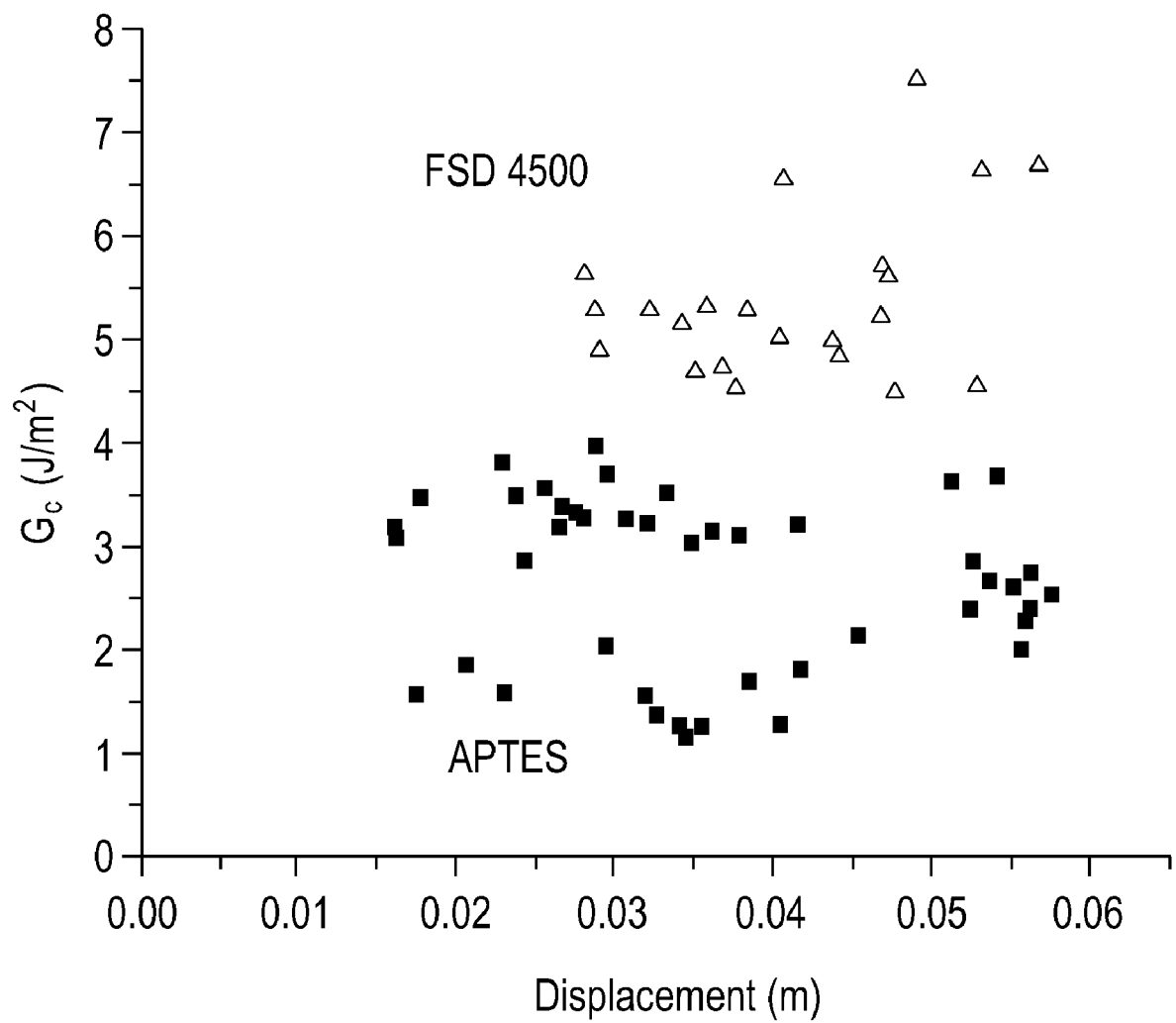
FIG. 2 graphically illustrates fracture energies as a function of crack lengths measured using a double cantilever beam instrument.

FIG. 2 graphically illustrates adhesion energies as a function of crack lengths measured using a double cantilever beam (DCB) instrument for both the fluorosilane and APTES release layers. The average adhesion energy with a fluorosilane release layer was 5.6 J/m$^2$. Use of APTES instead reduced the average adhesion energy to 2.1 J/m$^2$.

Figure 3:
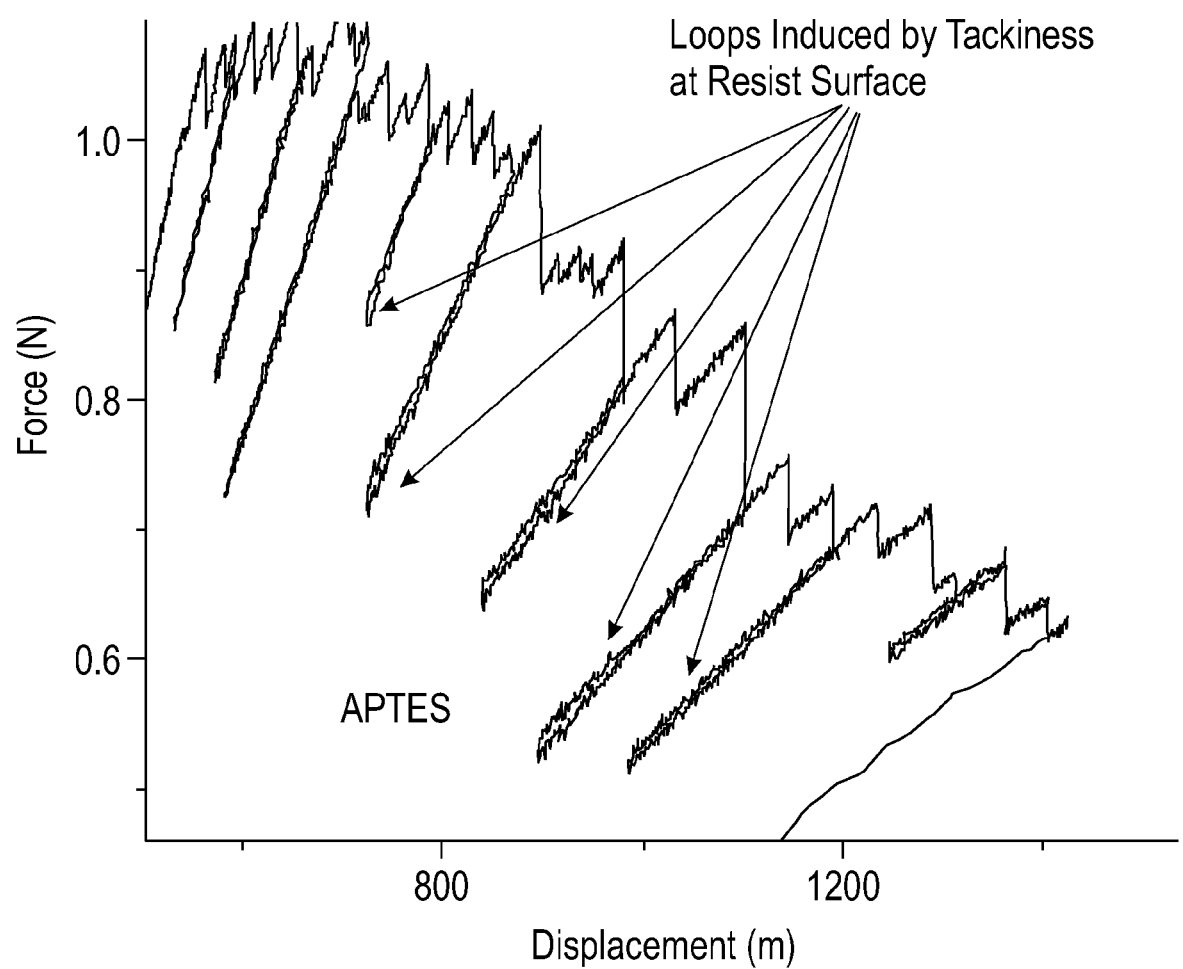
FIG. 3. graphically illustrates double cantilever beam measurements of force as a function of displacement for the vinyl ether resist—APTES interface.

In FIG. 3, the behavior of the resist during the DCB measurement showed that it was considerably softened near the surface relative to the resist cured adjacent to a fluorosilane layer. The reduction of adhesion energy was unexpected because APTES is normally used as an adhesion promoter, not a release agent.

XPS studies of the newly separated interfaces were used to determine whether the crack path followed the resist—template interface or not. Confinement of the crack to the interface is highly desirable to avoid damage to the cured resist or the template during the imprinting process. Results for the APTES-vinyl ether system are shown in Table 1 below, which provides elemental concentrations for the APTES release layer. It is clear from the N concentration data that the amine function was not removed during cure, ensuring its presence for subsequent cure-release cycles.

TABLE 1

| APTES | ATOMIC CONCENTRATION (%) | | | | |
|---|---|---|---|---|---|
| | C1s | N1s | O1s | F1s | Si2p |
| Si side pt 1 | 66.7 | 0.2 | 26.6 | 3.5 | 3.0 |
| glass side pt 4 | 18.0 | 1.1 | 53.8 | 4.0 | 23.1 |
| glass side pt 1 | 17.7 | 2.0 | 49.7 | 8.4 | 22.1 |
| unused pt 2 | 21.6 | 1.8 | 52.7 | 0.4 | 23.5 |
| unused pt 3* | 18.5 | 1.9 | 54.7 | 0.4 | 24.6 |

As referenced above, the term "APTES-Si side" refers to analysis of the cured resist after separation; "APTES-glass side" refers to analysis of the quartz side after separation: "APTES unused" refers to analysis of a virgin layer; and "APTES layer" refers to analysis on quartz.

It is not essential that the release layer be an amine, only that it be a strong base. Other thin adsorbed layers that function as bases such as phosphinosilanes can be used.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both not and in the future, may make various improvements and enhancements which fall within the scope of the claims which follow. These claims should be construed to maintain the proper protection for the invention first described.

What is claimed is:

1. A step and flash imprint process comprising:
   coating a selected surface of a micropatterned template with a single layer consisting of a release composition consisting of γ-aminopropyltriethylsiloxane;
   imprinting the template onto a photocationically curable composition, wherein the photocationically curable composition comprises a vinyl ether and a radiation sensitive photo acid generator;
   curing the photocationically curable composition to form an imprinted composition, wherein the release composition is effective to locally inhibit acid catalysis of the photocationically curable composition at an interface between the template and the imprinted composition; and
   releasing the template from the imprinted composition.

2. A step and flash imprint process comprising:
   coating a selected surface of a micropatterned template with a single layer of a release composition consisting of a compound having a basic reactive moiety;
   imprinting the template onto a photocationically curable composition;
   curing the photocationically curable composition to form an imprinted composition, wherein the release composition having the basic reactive moiety is effective to locally inhibit curing of the imprinted composition at an interface between the template and the imprinted composition, and wherein function of the basic moiety is not removed during curing; and
   releasing the template from the imprinted composition.

3. The process of claim 2, wherein the photocationically curable composition comprises at least one polymerizable group selected from a group consisting of epoxides, oxetanes, vinyl ethers, and mixtures thereof.

4. The process of claim 2, wherein the release composition having the basic reactive moiety is γ-aminopropyltriethylsiloxane.

5. The process of claim 2, wherein the release composition having the basic reactive moiety is γ-aminopropyltriethylsiloxane and the photocationically curable composition is a vinyl ether.

6. A step and flash imprint process comprising:
   coating a selected surface of a micropatterned template with a single layer consisting of γ-aminopropyltriethylsiloxane; wherein the template is transparent to UV radiation;
   imprinting the template onto a UV curable vinyl ether photoresist composition;
   curing the UV curable vinyl ether photoresist to form a cured vinyl ether composition, wherein the γ-aminopropyltriethylsiloxane is effective to locally inhibit curing of the imprinted composition at an interface between the template and the cured vinyl ether composition, wherein amine function is not removed during curing; and
   releasing the template from the UV curable composition.

* * * * *